(12) United States Patent
Turner (10) Patent No.: US 6,255,850 B1
(45) Date of Patent: *Jul. 3, 2001

(54) INTEGRATED CIRCUIT WITH BOTH CLAMP PROTECTION AND HIGH IMPEDANCE PROTECTION FROM INPUT OVERSHOOT

(75) Inventor: John Turner, Santa Cruz, CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/057,361

(22) Filed: Apr. 8, 1998

Related U.S. Application Data (60) Provisional application No. 60/063,546, filed on Oct. 28, 1997.

(51) Int. Cl.[7] .................. H03K 19/0175; H03K 19/094; H03K 3/01
(52) U.S. Cl. .................. 326/81; 326/81; 326/83; 326/86; 326/121; 327/534
(58) Field of Search .................. 326/80, 81, 86, 326/83, 121; 327/534

(56) References Cited

U.S. PATENT DOCUMENTS

| | | |
|---|---|---|
| 4,090,236 | 5/1978 | Bennett et al. . |
| 4,317,181 | 2/1982 | Teza et al. . |
| 4,361,873 | 11/1982 | Harper . |
| 4,503,494 | 3/1985 | Hamilton et al. . |
| 4,609,986 | 9/1986 | Hartmann et al. . |

(List continued on next page.)

FOREIGN PATENT DOCUMENTS

| | | |
|---|---|---|
| WO 96/37958 | 11/1996 | (WO) . |
| WO 97/21273 | 6/1997 | (WO) . |

OTHER PUBLICATIONS

Xilinx Corp., The Programmable Logic Data Book, "XC4000, XC4000a, XC4000H Logic Cell Array Families", pp. 2–7 to 2–46 (1994).

Xilinx Corp., The Programmble logic Data Book, "XC3000, XC3000A, XC3000L, XC3100, XC3100A, Logic Cell Array Families", pp. 2–105 to 2–124 (1994).

Altera Corp., data sheet, "FLEX 8000 Programmable Logic Device Family", pp. 1–22 (version 4, Aug., 1994).

C. Hu, "Future CMOS Scaling and Reliability", Proceedings of the IEEE, p. 682. May 1993.

(List continued on next page.)

Primary Examiner—Michael Tokar
Assistant Examiner—James H. Cho
(74) Attorney, Agent, or Firm—Morrison & Foerster LLP (57) ABSTRACT

An integrated circuit is provided for use with a supply voltage and which includes an input/output (I/O) circuit with an output driver with a pull-up transistor and a pull-down transistor and which includes an I/O pin connected to receive output signals from the output driver and connected to provide input signals to the integrated circuit, the protection circuit comprising: bias circuitry that imparts a bias voltage to the pull-up transistor so as to substantially prevent leakage current when a voltage applied externally to the I/O pin rises above the supply voltage; a switch connected to conduct current from the I/O pin to the supply voltage when the switch is turned on and to block current flow from the I/O pin to the supply voltage when the switch is turned off; and voltage clamp circuitry connected to clamp voltage on the I/O pin to the supply voltage when the switch is turned on; and programming circuitry which is programmable to turn the switch on and off.

43 Claims, 5 Drawing Sheets

U.S. PATENT DOCUMENTS

| | | |
|---|---|---|
| 4,617,479 | 10/1986 | Hartmann et al. . |
| 4,677,318 | 6/1987 | Veenstra et al. . |
| 4,713,792 | 12/1987 | Hartman et al. . |
| 4,871,930 | 10/1989 | Wong et al. . |
| 4,899,067 | 2/1990 | So et al. . |
| 4,901,283 | 2/1990 | Hanbury . |
| 4,912,342 | 3/1990 | Wong et al. . |
| 5,032,742 | 7/1991 | Zanders . |
| 5,041,964 | 8/1991 | Cole et al. . |
| 5,045,772 | 9/1991 | Nishiwaki et al. . |
| 5,066,873 | 11/1991 | Chan et al. . |
| 5,128,560 * | 7/1992 | Chern et al. ............................ 326/81 |
| 5,132,555 | 7/1992 | Takahashi . |
| 5,144,167 | 9/1992 | McClintock . |
| 5,151,619 | 9/1992 | Austin et al. . |
| 5,160,855 * | 11/1992 | Dobberpuhl ......................... 327/108 |
| 5,162,680 | 11/1992 | Norman et al. . |
| 5,241,224 | 8/1993 | Pedersen et al. . |
| 5,258,668 | 11/1993 | Cliff et al. . |
| 5,260,610 | 11/1993 | Pedersen et al. . |
| 5,260,611 | 11/1993 | Cliff et al. . |
| 5,272,393 | 12/1993 | Horiguchi et al. . |
| 5,274,828 | 12/1993 | McAdams . |
| 5,300,835 | 4/1994 | Assar et al. . |
| 5,309,399 | 5/1994 | Murotani . |
| 5,315,172 | 5/1994 | Reddy . |
| 5,331,219 | 7/1994 | Nakamura . |
| 5,336,986 | 8/1994 | Allman . |
| 5,350,954 | 9/1994 | Patel et al. . |
| 5,359,243 | 10/1994 | Norman et al. . |
| 5,381,062 | 1/1995 | Morris . |
| 5,396,128 | 3/1995 | Dunning et al. . |
| 5,402,375 | 3/1995 | Horiguchi et al. . |
| 5,414,312 | 5/1995 | Wong . |
| 5,416,661 | 5/1995 | Furuta . |
| 5,432,467 | 7/1995 | Reddy . |
| 5,436,575 | 7/1995 | Pedersen et al. . |
| 5,442,277 | 8/1995 | Mori et al. . |
| 5,444,397 | 8/1995 | Wong et al. . |
| 5,450,025 | 9/1995 | Shay . |
| 5,451,889 | 9/1995 | Heim et al. . |
| 5,453,705 | 9/1995 | Atallah et al. . |
| 5,467,031 | 11/1995 | Nguyen et al. . |
| 5,488,326 | 1/1996 | Shiraishi et al. . |
| 5,508,653 | 4/1996 | Chu et al. . |
| 5,528,548 | 6/1996 | Horiguchi et al. . |
| 5,530,392 | 6/1996 | Runas et al. . |
| 5,532,621 * | 7/1996 | Kobayashi et al. .................... 326/86 |
| 5,546,019 | 8/1996 | Liao . |
| 5,570,043 | 10/1996 | Churchill . |
| 5,576,635 | 11/1996 | Partovi et al. . |
| 5,589,783 | 12/1996 | McClure . |
| 5,600,264 * | 2/1997 | Duong et al. .......................... 326/39 |
| 5,604,453 | 2/1997 | Pedersen . |
| 5,629,634 | 5/1997 | Carl et al. . |
| 5,631,579 | 5/1997 | Miki et al. . |
| 5,635,861 | 6/1997 | Chan et al. . |
| 5,644,265 | 7/1997 | Austin et al. . |
| 5,646,548 | 7/1997 | Yao et al. . |
| 5,646,550 | 7/1997 | Campbell, Jr. et al. . |
| 5,661,414 | 8/1997 | Shigehara et al. . |
| 5,764,077 * | 6/1998 | Andresen et al. ...................... 326/34 |
| 6,028,450 | 2/2000 | Nance .................................... 326/81 |

OTHER PUBLICATIONS

R. Mozzami et al., "Projecting Gate Oxide Reliability and Optimizing Reliability Screens", IEEE Trans. on Electron. Devices, p. 1643, Jul. 1990.

T. Chan et al., "The Impact of Gate–Induced Drain Leakage Current on MOSFET Scaling", IEDM Tech. Dig., p. 718, 1987.

J. Williams, Mixing 3V and 5V ICs, IEEE Spectrum, p. 40, Mar. 1993.

B. Prince, et al., "H5C going on a 3–V diet", IEEE Spectrum, p. 22, May 1992.

B. Davari et al., "CMOS Scaling for High Performance and Low Power—The Next Ten Years", Proceedings of the IEEE, p. 595, Apr. 1995.

A. Chandrakasan et al., "Low–Power CMOS Digital Design", IEEE Journal of Solid–State Circuits, p. 473, Apr. 1992.

M. Kakumu et al., "Power–Supply voltage Impact on Circuit Performance for Half and Lower Submicrometer CMOS LSI", IEEE Trans. on Electron Devices, p. 1902, Aug. 1990.

S. Reddy et al., "A High Density Embedded Array Programmable Logic Architecture", in Proc. CICC, May 1996, p. 12.4–1.

R. Patel et al., "A 90.7 MHz–2.5. Million Transister CMOS CPLD with JTAG Boundary Scan and In–System Programmability," in Proc. CICC, p. 24.5.1, May 1995.

The 2.5V Power Supply Interface Standard, JEDC Standard, No. 8–5.

D. Dobberpuhl et al., "A 200–MHz 64–b Dual Issue–CMOS Microprocessor," IEEE Journal of Solid–State Circuits, p. 1555, Nov. 1992.

M. Pelgrom et al., "A 3/5 Compatible I/O Buffer", IEEE Journal of Solid–State Circuits, p. 823, Jul. 1995.

M. Ueda et al., "A 3.3V ASIC for Mixed Voltage Applications With Shut Down Mode", in Proc. CICC, p. 25.5.1, May 1993.

A. Roberts et al., "A256K SRAM With On–Chip Power Supply Conversion", IEEE International Solid–State Circuits Conference, p. 252, Feb. 1987.

K. Ishibashi et al., "A Voltage Down Converter With Submicroampere Standby Current for Low–Power Static RAM's", IEEE Journal of Solid–State Circuits, p. 920, Jun. 1992.

Xilinx Corp., The Programmble Logic Data Book, "The Best of XCELL", pp. 9–1 to 9–32(1994).

Intel Datasheet entitled "Pentium Processor at iCOMP Index 815/100 MHz, Pentium Processor at iCOMP Index 735/90 MHz, Pentium Processor at iCOMP Index 610/75, with Voltage Reduction Technology," Copyright Intel Corporation 1996, Order No. 242973–001, Mar. 1996, pp. 1–73.

Intel Datasheet entitled "Pentium Processors with Voltage Reduction Technology", Order No. 242557–005, Aug. 1996, pp. 1–81.

Foss, R.C. et al., "Application of a High–Voltage Pumped Supply for Low–Power DRAM", Mosaid Technologies Incorporated Publication, Canada, Jan. 24, 1992, two pages.

Alfke, P., "Low–Voltage FPGAs Allow 3.3–V/5–V System Design," *Electronic Design*, pp. 70–76(even) (Aug. 18, 1997).

Xilinx, "I/O Characteristics of the XL FPGAs," Application Note XAPP 088 (Nov. 12, 1997).

* cited by examiner

INTEGRATED CIRCUIT WITH BOTH CLAMP PROTECTION AND HIGH IMPEDANCE PROTECTION FROM INPUT OVERSHOOT

This Appln claims the benefit of U.S. Provisional No. 60/063,546 filed Oct. 28, 1997.

BACKGROUND OF THE INVENTION

1. Field of the Invention

The invention relates in general to integrated circuits, and more particularly, to protection from high voltages on integrated circuit input/output pins.

2. Description of the Related Art

Input/output ("I/O") circuits are used to input electronic signals to and output electronic signals from integrated circuits. A typical integrated circuit ("IC") includes an integral I/O circuit for each of its externally accessible I/O pins. An I/O circuit usually includes a driver circuit which receives signals from the IC and outputs them to the I/O pin. It also generally includes an input buffer which receives signals from the I/O pin and inputs them to the IC. A typical I/O circuit also includes an enable circuit which can place the driver circuit in either a high impedance state in which signals can be input to the IC via the I/O pin, or in an output enabled state in which signals can be output from the IC via the I/O pin.

I/O circuits transfer signals to and from integrated circuit devices in a variety of types of electronic systems. For instance, I/O circuits may be used to interconnect integrated circuits to a shared system bus so that multiple ICs connected to the bus can communicate with each other. In many electronic systems all of the integrated circuits connected to a system bus operate at the same supply voltage level. However, as the dimensions of the circuits in ICs have decreased, the supply voltages employed by ICs also have decreased. As a result, there has been a proliferation of mixed signal systems in which some ICs connected to a system bus operate at a higher supply voltage (e.g., 5-volts), and other ICs connected to the same system bus operate at a lower supply voltage (e.g., 3.3-volts).

A problem with mixed signal systems has been the occurrence of leakage currents, over the system bus, from an IC operating at a higher supply voltage to an IC operating at a lower supply voltage. For instance, an IC operating with a 3.3 volt supply may experience an overvoltage when an IC connected to the same bus as the 3.3 volt device drives a 5 volt signal onto the bus. An IC may experience an overvoltage, for example, when the voltage on one of its I/O pins is greater than the IC's internal supply voltage. As used herein, an IC's internal voltage includes both core and peripheral supply voltages, which may have the same or different values. Thus, leakage current may result when an output level high signal is imparted from one IC onto an I/O pin of another IC operating at a lower supply voltage.

Figure 1:
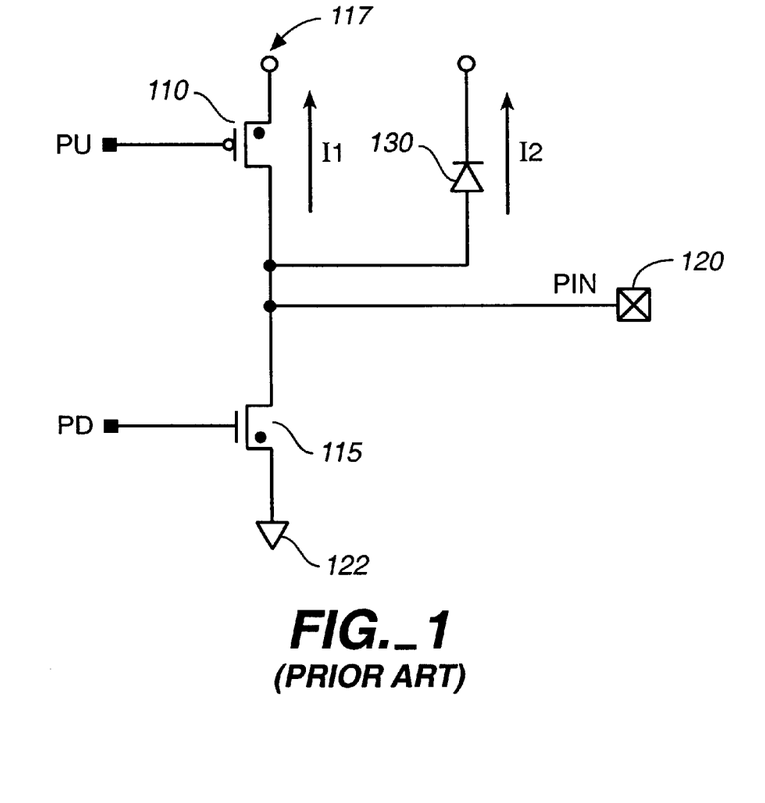
FIG. 1 is a circuit diagram of a conventional pull-up/pull-down driver circuit.

The illustrative drawing of FIG. 1 shows a pull-up/pull-down driver circuit which will be used to explain such leakage currents. The driver circuit includes a pull-up driver 110 and a pull-down driver 115. In this example, pull-up driver 110 is a p-channel (PMOS) transistor, and pull-down driver 115 is an n-channel (NMOS) transistor. Pull-up driver 110 is coupled between a supply voltage 117 and a pin (or pad) 120. Pin 120 is referred to as an I/O pin as it may be used for input or output, or both. Pull-down driver 115 is coupled between pin 120 and a supply voltage 122. Supply 117 is typically VDD or VCC and supply 122 is typically VSS.

In operation, the output buffer will generate a logic high, logic low, or be tristated (i.e., high impedance state) depending on the logic signals at PU and PD. PU is provided to a gate of pull-up driver 110, and PD is provided to a gate of pull-down driver 115. When PU is a low and PD is a low, the pull-up drive 110 is on and the pull-down driver 115 is off, and the pin will be driven high (to the level of VCC). When PU is high and PD is high, the pull-up driver 110 is off and the pull-down driver 115 is on, and the pin will be driven low (to the level of VSS). When PU is high and PD is low, both the pull-up driver 110 and the pull-down driver 115 are off, and the pin 120 will be tristated. Pin 120 is typically also coupled to an input buffer (not shown) for the inputting of logical signals into the integrated circuit and the core. Pin 120 may be used as an input when the output buffer is placed in tristate, or may also be used to feed back signals from the output buffer into the integrated circuit.

However, the driver circuit shown in FIG. 1 is not tolerant to high voltages, and may not be useful in the case where input voltages are imparted by an integrated circuit having a supply voltage above a level of the first supply voltage 117. For example, when the output buffer is tristated, signals are input to the input buffer (not shown) via pin 120. If first supply 117 is 3.3 volts, then when interfacing a 5-volt integrated circuit, pin 120 may potentially be 5 volts or above. A 5-volt input would represent a logic high input. This voltage may even go above 5 volts during transitions due to overshoots. This poses potential problems.

An I1 current sneak path (or leakage path) may occur when the VPIN (the voltage level at the pin) goes above 3.3 volts+|VTP|. VTP is the threshold voltage of pull-up driver 110. Furthermore, in an embodiment, pull-up driver 110 is a PMOS transistor and formed in an n-well on a p-type substrate. In that case, there may be a parasitic diode 130 between pin 120 and first supply 117. Parasitic diode 130 represents the diode between the p-diffusion used to form the drain and the n-well region, which is connected to the first supply voltage 117. Therefore, an I2 current sneak path will also occur when the VPIN goes above 3.3 volts+Vdiode. Vdiode is the turn-on or forward voltage (VF) of the diode.

Leakage current paths I1 and I2 represent a DC (direct current) path which can cause the first supply (VCC) to rise. If VCC rises above maximum allowable levels and remains at those levels for longer than an acceptable time, the device may have oxide reliability issues. One solution to the problem of leakage currents in mixed signal systems is to provide voltage overshoot protection that blocks the flow of leakage current in overshoot situations.

Some examples of solutions to current leakage problems resulting from voltage overshoot on I/O pins are proposed in the following patents: U.S. Pat. No. 5,151,619, entitled, "CMOS Off Chip Driver Circuit", issued to Austin, et al.; U.S. Pat. No. 5,450,025, entitled, "Tristate Buffer For Interfacing to a Bus Subject to Overvoltage Conditions", issued to Shay; U.S. Pat. No. 5,396,128, entitled, "Output Circuit For Interfacing Integrated Circuits Having Different Power Supply Potentials", issued to Dunning, et al.; U.S. Pat. No. 5,467,031, entitled, "3.3 Volt CMOS Tri-State Driver Circuit Capable of Driving Common 5 Volt Line", issued to Nguyen, et al.; and U.S. Pat. No. 5,546,019, entitled, "CMOS I/O Circuit With 3.3 Volt Output And Tolerance of 5 Volt Input", issued to Liao.

The Peripheral Component Interconnect (PCI) system architecture is an example of an architecture that imposes specific requirements upon I/O circuits that are quite different from the typical requirements in mixed signal systems.

For instance, a requirement of a typical PCI system in a 3.3 volt environment (a system environment in which all ICs connected to the system bus have a 3.3 volt supply), calls for integrated circuits with I/O circuits that include internal termination which can sink current from a PCI system bus to the individual ICs'3.3 volt supplies. Typically, this PCI system architecture requirement is satisfied by an internal clamp circuit which includes a clamping diode which provides a current sink path from an IC's I/O circuit to its internal supply voltage. A purpose of this requirement, for example, is to sink current in order to quickly dissipate ringing voltage overshoot excursions on an I/O pin.

From a practical standpoint, it is desirable for ICs to be built to be useable in either a mixed signal system or a PCI system or in both simultaneously, for example. Unfortunately, as explained above, the performance requirements of these different systems often may be at odds with each other. Specifically, an I/O circuit in a typical mixed signal system blocks the current flow in overvoltage situations. In contrast, an I/O circuit in a PCI compliant system must conduct (or sink) current from an I/O pin to the internal supply voltage in voltage overshoot situations.

An earlier solution to these conflicting requirements was to add individual internal diodes with anodes connected to the I/O pins and with cathodes connected to an internal Vtt rail. This solution is described in, "Low-Voltage FPGAs Allow 3.3-V/5-V system Design", Electronic Design, Aug. 18, 1997, by Peter Alfke; and Application Note, XAPP 088, Nov. 12, 1997 (Version 1.0), by Xilinx, Inc, San Jose, Calif. This internal Vtt rail is internally connected to multiple I/O pins. For PCI compliance, this Vtt rail is connected externally to the appropriate supply voltage, 5 volts or 3.3 volts, for example. For mixed signal tolerant systems, the Vtt rail is left unconnected or floating.

There are shortcomings with this solution. Since multiple I/O pins all are internally connected to the Vtt rail, eight in the reference documents identified above, these I/O pins cannot be configured individually to operate in PCI compatible mode or a mixed signal tolerant mode. Rather, they are configured collectively, or as a group. Also, it is not possible to configure one I/O pin to comply with a PCI system requirements and to configure another I/O pin to comply with a mixed signal tolerant system. Moreover, the actual process of configuring the multiple I/O pins involves externally connecting the Vtt rail for PCI system operation or leaving it unconnected for mixed signal system operation. Connecting the Vtt rail or leaving it unconnected typically involves printed circuit board (PCB) level design decisions which may be difficult to change if there is a change in the plans for I/O pin usage later in an overall system design process.

Therefore, there has been a need for integrated circuits with improved I/O circuitry suitable for use in both mixed signal tolerant systems and PCI compatible systems. Moreover, there has been a need for integrated circuits with I/O circuitry that permits such ICs to be used simultaneously in mixed signal systems and in PCI compatible systems, for example. The present invention meets these needs.

SUMMARY OF THE INVENTION

The invention provides more versatile voltage overshoot protection for I/O circuits. In one aspect the invention provides an I/O circuit with two different protection circuits. A first protection circuitry substantially prevents leakage current when voltage applied externally to an I/O pin rises above an integrated circuit's supply voltage. A second protection circuit sinks current from the I/O pin when voltage applied externally to the I/O pin rises above the supply voltage. Programming circuitry is programmable to cause the first circuit or the second circuit to be operative.

The first circuit is well suited to provide voltage overshoot protection in mixed signal systems. The second circuit is well suited to provide voltage overshoot protection in systems such as, the PCI system architecture, in which there is a requirement to sink current from an I/O pin when the I/O pin voltage rises above the integrated circuit's supply voltage. Moreover, the programming circuitry permits the selection of different types of overshoot protection on different I/O pins of the same integrated circuit, and permits changes to the selection of I/O pin protection later in the system design and development cycle.

These and other features and advantages of the invention will be better appreciated from the following detailed description of the invention together with the appended drawings.

DESCRIPTION OF THE PREFERRED EMBODIMENTS

The present invention comprises an integrated circuit with a novel input/output circuitry which includes a clamp overvoltage protection circuit and a high impedance overvoltage protection circuit and a programming circuit for causing one or the other of the protection circuits to be operative. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Overview

The I/O circuits of the present invention are implemented in integrated circuits. A present embodiment of the invention is implemented in a particular type of integrated circuit called a programmable logic device. Programmable logic devices (sometimes referred to as PALs, PLAs, FPLAs, PLDs, EPLDs, EEPLDs, LCAs, or FPGAs), are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. No. 5,241,224 and 4,871,930, and the *Altera Data Book*, June 1996, all incorporated herein by reference. The latter are described in, for example, U.S. Pat. Nos. 5,258,668, 5,260,610, 5,260,611, and 5,436,575, and the *Altera Data Book*, June 1996, all incorporated herein by reference for all purposes. Logic devices and their operation are well known to those of skill in the art.

Figure 2:
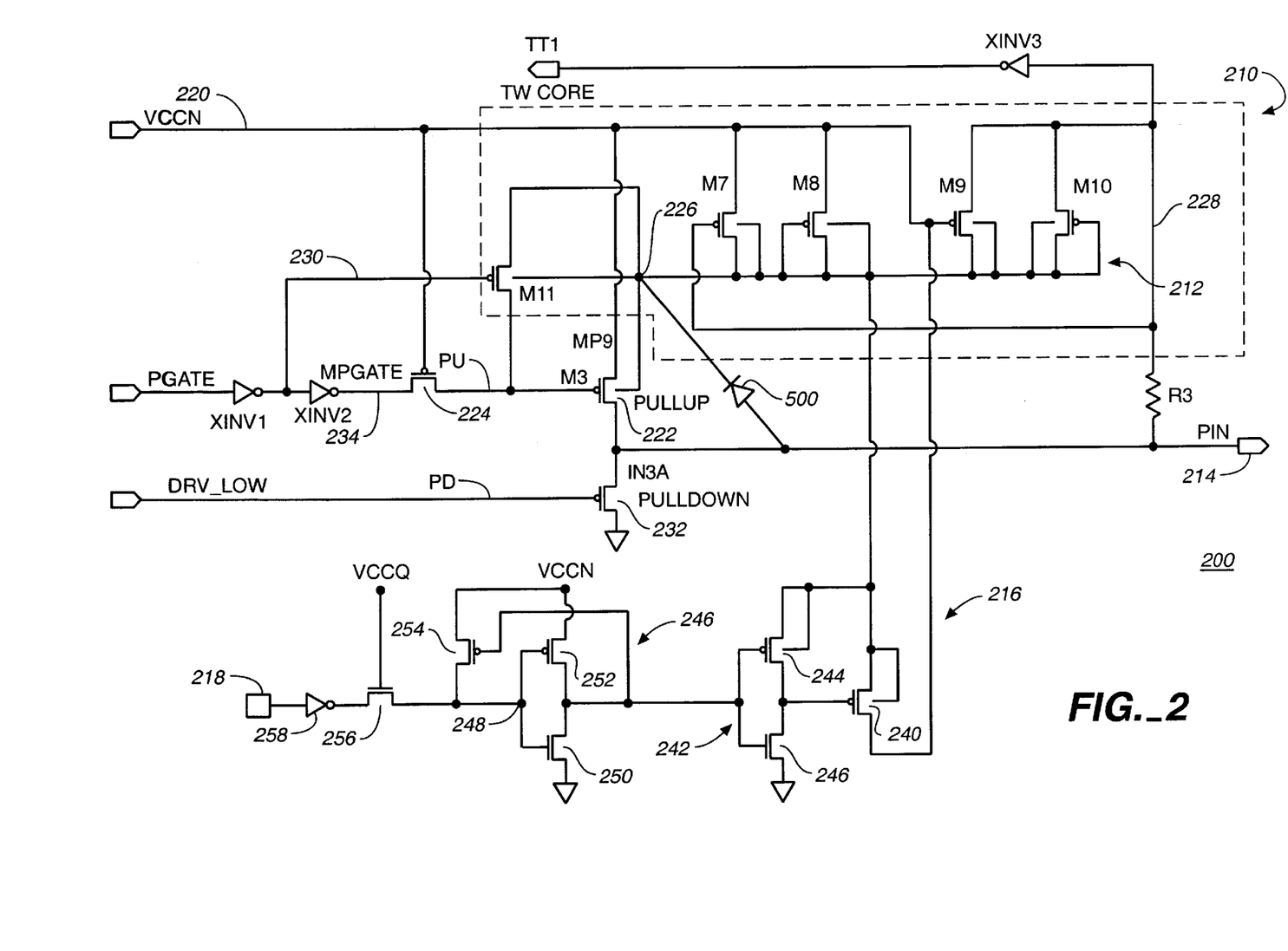
FIG. 2 is a circuit diagram of a high-voltage tolerant I/O circuit with current blocking circuitry and current sink-voltage clamp circuitry and programming circuitry for selecting between them in accordance with a presently preferred embodiment of the invention.

Referring to the illustrative drawings of FIG. 2, there is shown a circuit diagram of input/output circuitry 200 for a single I/O pin in accordance with a presently preferred embodiment of the invention. The I/O circuitry is programmable to either block current flow from an overvoltage on an I/O pin or to sink current from the I/O pin to an internal supply voltage upon the occurrence of an overvoltage on the pin. The I/O circuitry, therefore, can be programmed to provide overvoltage tolerance in mixed signal systems, or it can be programmed to comply with PCI system architecture requirements, for example. Although the description herein refers to the I/O circuitry for a single I/O pin, it will be appreciated that multiple pins of an integrated circuit may be equipped with the inventive I/O circuitry.

A present embodiment of the invention includes first overvoltage protection circuitry for use in mixed signal tolerant systems. The first overvoltage protection circuitry 210 includes an n-well bias generator 212 used to prevent the conduction of leakage current to an internal supply voltage VCCN of the integrated circuit. Such leakage current could result in a rise of the internal supply voltage if the voltage on the I/O pin 214 exceeded the internal supply voltage, and the supply voltage VCCN was unable to absorb the leakage current. The present embodiment also includes a second overvoltage protection circuitry 216 which includes clamp circuitry which conducts or "sinks" current from the I/O pin 214 to the internal supply voltage VCCN when the voltage on the pin exceeds an internal supply voltage. The embodiment also includes programming circuitry 218 which can program either the first or second protection circuits 212 or 216 to be operative.

When the first overvoltage protection circuitry, 210 is operative, leakage current is blocked from reaching the internal supply voltage VCCN of the integrated circuit. In operation, the n-well (indicated by dashed lines) is biased to approximately follow the voltage on the I/O pin 214. The n-well voltage is applied to the back gate of a p-channel pull-up driver transistor 222 to produce a high impedance (or off) condition which prevents the occurrence of leakage currents from the I/O pin to the supply voltage when there is a voltage overshoot or even simple ringing on the I/O pin. A voltage overshoot occurs, for example, when voltage on the I/O pin 214 rises above the supply voltage VCCN. Thus, in a mixed signal system with both higher supply voltage IC devices (e.g., 5 volt) and lower supply voltage IC devices (e.g., 3.3 volts), for example, an overvoltage on the I/O pin of the lower voltage device does not result in current loading on the higher voltage driving (or sending) IC device or on the lower voltage IC device.

When the second overvoltage protection circuitry 216 is operative, a clamp circuit provides for signal termination during overvoltage episodes, by sinking current from the I/O pin 214 to the internal supply voltage VCCN. The clamp circuitry in the presently preferred embodiment is compliant with the PCI system architecture. For example, in accordance with PCI, an integrated circuit has an internal supply voltage of 3.3 volts, and the clamp circuit should be able to conduct 25 mA when the I/O pin voltage exceeds the supply voltage by one volt, and should be capable of sinking 225 mA when the I/O pin voltage is 4 volts over the internal supply voltage. In a present embodiment, when the clamp circuit is operative, the erstwhile floating n-well is clamped to a prescribed voltage so that the n-well voltage does not float with the voltage on the I/O pin, and so that a current sinking path is provided from the I/O pin 214 to the supply voltage VCCN.

Leakage Current Blocking Overvoltage Protection Circuitry

The leakage current blocking first overvoltage protection circuitry 210 is disclosed in commonly assigned patent applications entitled, Overvoltage-Tolerant Interface for Integrated Circuits, Ser. No. 08/863,886, filed May 27, 1997; Circuitry of Low Internal Voltage Integrated Circuit, Ser. No. 08/863,876, filed May 27, 1997; Technique of Fabricating Integrated Circuits Having Interfaces Compatible With Different Operating Voltage Conditions, Ser. No. 08/863,879, filed May 27, 1997; and Interface For Low Voltage Semiconductor Devices, Ser. No. 08/863,905, filed May 27, 1997, all of which are incorporated herein by this reference.

FIG. 2 shows an input/output circuit 200 which will allow interfacing with high voltages at I/O pin 214. In this embodiment, a well bias generator 212 is used to bias an n-well and a gate of pull-up driver 222. FIG. 2 also shows an input buffer XINV3 which is coupled to I/O pin 214 for coupling signals to the core of the integrated circuit. A further discussion of the input buffer is presented in the commonly assigned patent applications identified above.

The embodiment in FIG. 2 has a supply voltage 220. The integrated circuit may have a "noisy" power supply (i.e., VCCN) and a "quiet" power supply (i.e., VCCQ). Both the noisy and quiet supplies may be connected to the same voltage level. However, the noisy power supply typically is connected to a separate pin from a quiet power supply. On the integrated circuit, the noisy power supply ordinarily is connected to circuitry which generates or is subject to noise, while the quiet power supply ordinarily is connected to relatively quiet circuitry. By separating the power supplies in this fashion, the circuitry connected to the quiet power supply may be isolated somewhat from switching and other types of noise present on the noisy power supply.

More specifically, the noisy supply would be connected to relatively noisy, circuitry such as output drivers (e.g., supply voltage 220 may be a noisy supply). For example, output drivers often generate noise from ground bounce. For instance, circuitry used to interface with a bus or other integrated circuits generally would be connected to the noisy supply since these interface circuits are typically considered "noisy." However, circuits in the core logic region of such an integrated circuit ordinarily would be connected to the quiet supply since these circuits are typically considered "quiet." This will tend to help prevent the coupling of noise into the core of the integrated circuit.

In certain embodiments, such as will be described below, it may be desirable to couple certain devices (e.g., transistor 224 or others) to the second supply voltage, which would be a quiet supply voltage. Then, supply voltage 220 would be the noisy supply. In this embodiment, the devices are coupled to the same supply voltage 220, which may be a noisy or quiet supply. In a specific embodiment, supply voltage 220 will be a noisy supply voltage while the core of the integrated circuit is coupled to a quiet supply voltage.

Well bias generator 212 includes transistors M7 and M8 which are coupled between supply voltage 220 and a bias generator output node 226. A gate of transistor M7 is coupled to a node 228. A gate of transistor M8 is coupled to bias output node 226.

In a present embodiment, the bias generator output node 226 is implemented as a metal layer connection that is electrically connected, using one or more n+ regions, to the n-well. Thus, output node 226 taps into the n-well voltage.

Transistors M9 and M10 are coupled between a node 228 and the bias output node 226. A gate of transistor M9 is coupled to supply 220. A gate of transistor M10 is coupled to bias output node 226.

Node 228 is connected through a resistor R3 to I/O pin 214. Resistor R3 may be used to provide electrostatic discharge (ESD) protection for devices M7, M9, M10 and XINV3 from pin 214. Transistor M8 does not require ESD protection since it does not contact node 228. Alternatively, resistor R3 might be omitted, and other techniques for ESD protection may be used. The voltage at node 228 is the I/O pin voltage, subject to ESD protection.

Additionally, transistor M11 is coupled between the bias output node 226 and PU. An inverter chain including inverters XINV1 and XINV2 drive through pass transistor 224 to PU. Pass transistor 224 may be substituted with other pass gate structures. Pass transistor 224 may be substituted with a transmission gate, CMOS transmission gate (including an NMOS transistor and a PMOS transistor), two or more transistors in series, and many other specific circuit implementations. An output 230 of XINV1 drives a gate of transistor M11.

In a preferred embodiment transistors M7, M8, M9, M10, and M11 are PMOS transistors. N-well connections for transistors M7. M8, M9, M10, and M11 are coupled to bias output node 226.

In operation, well-bias generator 212 generates a bias output voltage 226 which is used to prevent leakage currents. As shown in FIG. 2, bias output node 226, which represents the n-well, is coupled to the back gate of pull-up driver 222. Furthermore, transistor M11 serves as a switch that can couple or decouple the gate of pull-up driver 222 from bias output node 226 depending on the conditions. Thus, the back gate of the pull-up driver 222 is biased by the bias generator 212.

More specifically, when PU is low, the output of inverter XINVl will be high. In this case, transistor M11 will be off and effectively decoupled from node PU. In this case, when I/O pin 214 is driven to a logic high, the I1 and I2 leakage current paths are not of a concern.

On the other hand, when PU is high, the output of inverter XINVl will be low. In this case, transistor M11 will be on. Transistor M11 will effectively couple the gate of pull-up transistor 222 to the gate of transistor 222. Essentially, the gate of PU will track the voltage at gate bias output node 226 in order to prevent or at least substantially reduce current path I1 described above.

Voltage bias generator 212 will be described in connection with the voltage conditions at I/O pin 214. In particular, bias output node 226 will be VCC (i.e., the level at supply voltage 220) when pin 214 is in a range from ground to about VCC−|VTP|. VCC is the voltage at supply 220, and |VTP| is the threshold voltage for a PMOS transistor. N-well voltage generator bias output node 226 is coupled to VCC through transistor M7, which will be in a conducting or on state. Under these conditions, voltage bias generator 212 prevents I1 and I2 current paths. Specifically, the gate and n-well of pull-up driver 222 will be biased to VCC. Since VPIN (i.e., the voltage level at pin 214) will be less than VCC, I1 and I2 will be zero.

In the case when pin 214 is above about VCC−|VTP| but below about VCC, transistor M7 will be off. Bias output node 226 will be held to about VCC−|VTP| through transistor M8. Note that transistor M8 may be substituted with a diode or similar device or component. For example, the p-n junctions of the transistors 222, M7, and M8 form such a diode. This would serve a similar function of maintaining bias output node 226 at around VCC−VF. VF is the forward voltage of the diode. Under these conditions, voltage bias generator 212 keeps the gate and n-well of pull-up driver 222 biased properly. The I1 and I2 current paths are not of concern.

In the case when pin 214 goes above VCC, but below about VCC+|VTP|, bias output node 226 will be about VPIN−|VTP|, where VPIN is a voltage level at pin 214. Bias output node 226 will be held at this level through transistor M10. Transistor M10 acts like a diode, analogous to transistor M8. Similarly, transistors M10 may also be substituted with a diode structure or other device or component as discussed in the case for transistor M8. For example, such a diode is present in the p-n junctions of transistors M9 and M10. Under these conditions, the gate and n-well of pull-up driver 222 will be about VPIN−|VTP|. The I1 and I2 current paths will not be of concern. If |VTP| were slightly greater than the VF of the parasitic diode (see FIG. 1), then there may be a relatively small current I2. However, I2 would be zero when |VTP| is less than the VF of the parasitic diode.

In the case when pin 214 goes above about VCC+|VTP|, bias output node 226 will be VPIN. VPIN will be passed through transistor M9. Transistor M9 will be in a conducting state under these conditions. Under these conditions, the gate and n-well of pull-up driver 222 will be the same as VPIN. In this case, current paths I1 and I2 will also not occur.

Therefore, as described above, voltage bias generator 212 prevents the I1 and I2 sneak current paths in the case when a voltage above supply voltage 220 is placed at pin 214. For example, an integrated circuit with a 3.3-volt supply voltage may be driven with a 5-volt input voltage.

In a preferred embodiment for the circuitry in FIG. 2, pull-down driver transistor 232 and transistor M11 should be thick oxide devices. This is to ensure the gate oxide reliability at different voltage stress conditions. For pull-down driver 232, a stress condition occurs when pin 214 is at about 5 volts and node PD is grounded. For transistor M11, a stress condition occurs when pin 214 is at about 5 volts, which makes node 226 about 5 volts, and node 230 will be at about ground. Further, the |VTP| for thick oxide devices may differ from the |VTP| for thin oxide devices. Therefore, transistors M7 and M9 may also be thick oxide devices in order to ensure they have a similar |VTP| as pull-up driver 222. This is important in order that voltage bias generator 212 track the characteristics of pull-up driver 222 properly. However, if |VTP| for thin oxide devices is less than that for thick oxide devices, then transistors M7 and M9 may be thin oxide devices. This is because the difference between the voltage at pin 214 and PU will be less than |VTP| of pull-up transistor 220. This ensures no I1 current path.

Transistors M3, M8, and M10 may also be thick oxide devices. Depending on the process technology used, there may be advantages to using thick oxide devices such as providing improved gate oxide stress tolerance, tracking of device parameters between devices, and other factors.

Further, devices M3, M7, M8, M9, and pull-up driver 222 may also be thick oxide devices to improve their oxide reliability. For example, an oxide stressing condition may occur when supply voltage 220 is off, and pin 214, node 228, and node PU are at 5 volts.

In an embodiment of the present invention, the control electrode of pass transistor 224 may be coupled to a noisy supply (VCCN) or the quiet supply (VCCQ). This connection may be made using a programmable option, such as by programmable link, fuse, programmable bit, and metal mask, just to name a few of the possible techniques. When the control electrode of transistor 224 is coupled to VCCQ, the other devices are coupled to supply 220, which would be VCCN.

In a situation when a voltage level of the VCCN is below that of VCCQ (e.g. VCCN is less than 3.3 volts and VCCQ is 3.3 volts; or VCCN is less than 2.5 volts and VCCQ is 2.5 volts), then the control electrode of transistor 224 should be coupled to VCCN. This prevents leakage from VCCQ to VCCN through transistor 224 since a node 234 at the output of XINV2 will be limited to VCCN-VTN; regardless of the voltage level at PU.

Another example where the control electrode of pass transistor 224 should be coupled to VCCN is when VCCQ is about 3.3 volts and VCCN is about 2.5 volts. Under those circumstances, with an allowance for ten percent tolerances on the VCCN and VCCQ, VCCQ may be about 3.6 volts and VCCN may be about 2.25 volts. If the control electrode of pass transistor 224 were coupled VCCQ of 3.6 volts, n-well voltage bias generator output node 226 may be 2.25 volts, and node PU will be about VCCQ-VTN, which is approximately 2.6 volts. Then, when node 230 is zero volts, there will be current flow through M11, since this device is on. This current flow will be from PU (at 2.6 volts) to bias output node 226 (at 2.25 volts) and to the pin 214. To minimize this current, M11 may be made into a weak transistor (e.g., by sizing the device).

Another solution is to connect the control electrode of pass transistor 224 to VCCN. This will limit the voltage at PU so that nothing will be driving PU when PU reaches VCCN-VTN.

Current Sink-Voltage Clamp Overvoltage Protection Circuitry

The current sink-voltage clamp protection circuitry 216 includes a p-channel transistor 240 which serves as a programmable switch. The p-channel switch transistor 240 is large, wide enough to conduct current sinked to the internal supply voltage 220 without an appreciable voltage loss. That it is, it is wide enough to present a low impedance. In a present embodiment, the p-channel transistor 240 is approximately 1500 microns wide. The switch transistor 240 is formed in the same n-well as transistors M7, M8, M9 and M11. The transistor 240 has a back gate connection to the n-well.

A source of the p-channel switch transistor 240 is connected to the n-well, and a drain of the switch transistor is connected to the internal supply voltage 220. A gate of the switch transistor is connected, as described more fully below, to be controllable by programmable switch control circuitry.

A clamp diode 500 is coupled between the switch transistor 240 and the I/O pin 214. In a present embodiment of the invention, the clamp diode 500 includes an anode connected to the pin 214 and a cathode connected to node 226 so as to voltage clamp the pin 214 to the supply voltage when the current sink-voltage clamp protection circuitry 216 is operative.

Figure 5A:
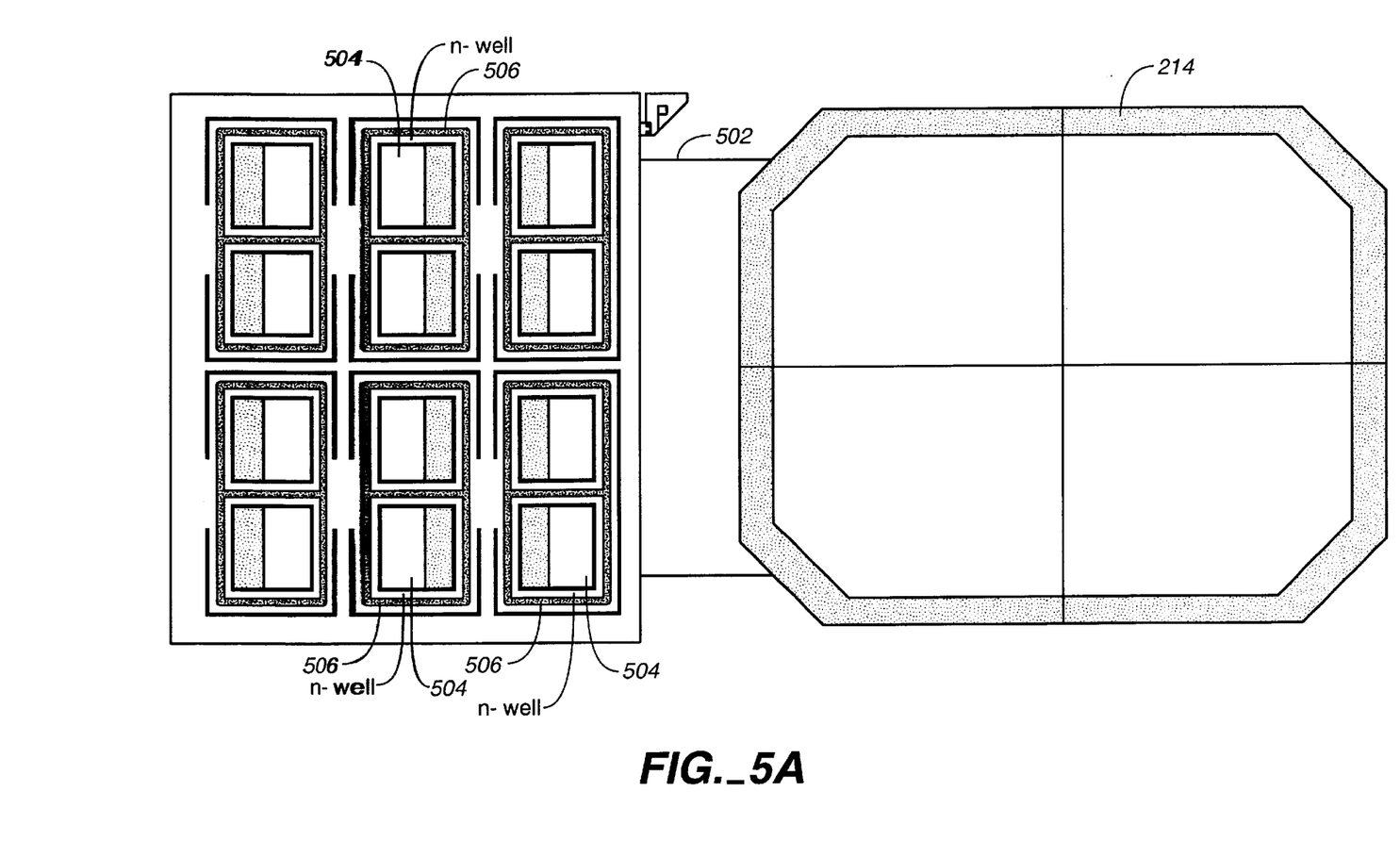
FIG. 5A is a circuit layout diagram of a clamp diode of the embodiments of FIGS. 2–4.
Figure 5B:
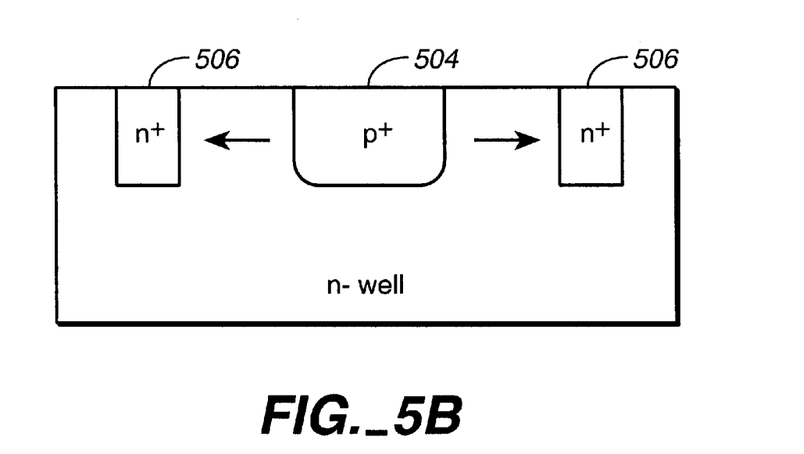
FIG. 5B is a cross sectional view of a portion of the diode of FIG. 5A.

Referring to FIG. 5A, there is shown an illustrative vertical view of a layout of a clamp diode 500, an I/O pin 214 and a metal layer 502 which interconnects the diode 500 and the I/O pin 214, and in FIG. 5B there is shown an illustrative cross-sectional view of a portion of the diode 500 of FIG. 5A which is situated in the n-well. As shown in FIG. 5A, the diode 500 is implemented as a diode array which includes multiple p+ doped regions (squares) 504. In the present embodiment, there are twelve p+ regions 504. The multiple p+ regions 504 are formed in the n-well. Each respective p+ region 504 is surrounded by a respective n+ doped region 506 formed in the n-well. Thus, there are twelve n+ regions formed in the n-well which respectively surround the twelve p+ regions 504 also formed in the n-well. These twelve of p+ regions 504 and their surrounding n+ regions 506 essentially constitute an array of twelve diodes. Collectively, the p+ regions serve as the anode of the diode 500, and the n+ regions serve as the cathode of the diode 500.

The structures in FIG. 5A which appear as dots represent vias which serve to interconnect various layers of the integrated circuit. It will be readily appreciated by those of ordinary skill in the art that the integrated circuit of the present embodiment includes multiple metal layers formed upon the semiconductor material in which the various semiconductor devices described herein are formed, and that vias between layers are employed to make electrical connections between various semiconductor regions and various metal layers of the integrated circuit. For instance, the multiple p+ regions 504 that comprise the anode are connected to metal in one metal layer, and the multiple n+ regions that comprise the cathode are connected to metal in another metal layer. The details of the via connections between layers are conventional and unimportant to an understanding and need not be described herein.

An advantage of constructing the diode 500 as an array of individual diodes is that there is an increased surface area for current flow from the p+ (anode) regions to the n+ (cathode) regions. Basically, each p+ region is surrounded by an n+ region, and current can be conducted laterally from all sides of the p+ regions 504 to the surrounding n+ regions 506. This increased surface area results in reduced electrical resistance. Another advantage is that the respective p+ regions 504 can be narrowly spaced apart from corresponding n+ regions 506 such that the distance that a lateral current must flow through the higher resistance n-well is shorter. The arrows in FIG. 5B represent the flow of current from an illustrative p+ region 504 to an illustrative surrounding n+ region 506 of the diode 500. The shorter the distance current must flow through the higher resistance n-well, the lower the overall resistance of the diode 500.

Alternatively, for example, the diode 500 could be implemented using a parasitic diode formed by the drain of the pull-up transistor 222 and the n-well or using diodes formed from transistors.

In operation, transistor 240 is switched to an "on" or conducting state when a low voltage is applied to its gate by inverter 242. In the "on" state, transistor 240 provides a current conduction path from the n-well to the internal supply voltage VCCN. If the voltage applied externally to the I/O pin 214 exceeds the internal supply voltage, during PCI overshoot for example, then an overvoltage condition exists, and there is a current conduction path from the I/O pin 214, through the diode 500 to node 226 of the the n-well, to the source junction of the switch transistor 240. The clamp diode 500 ensures that the current can only flow from the I/O pin 214, through the switch transistor 240, to the supply voltage 220 and not from the supply voltage 220, through the switch transistor 240, to the I/O pin 214. If the voltage applied to the I/O pin 214 exceeds the internal supply voltage, then current is sinked (conducted) through the switch transistor 240 to the supply voltage 220 until overshoot voltage has settled the voltage on the I/O pin 214 to approximately the same as the supply voltage or less. Thus, it can be said that the diode 500 clamps the I/O pin to the supply voltage. As a result, the leakage current blocking overvoltage protection circuitry 212 is inoperative since the I/O pin voltage is clamped and substantially cannot rise above the supply voltage.

It should be noted that, during an overvoltage on the I/O pin 214 with the p-channel switch transistor 240 turned on, there also may exist a secondary current conduction path through the pull-up transistor 222. Basically, as the voltage on the I/O pin increases to more than a transistor threshold above the internal supply voltage level, a backward conduction path through pull-up transistor 222 to the internal supply voltage may develop. Thus, when transistor 240 is turned on, current can be sinked from the I/O pin to the internal supply voltage 220 in the event of an overvoltage on the I/O pin. In a present embodiment, this current sinking capability meets the requirements specified for the PCI system architecture.

Transistor 240 is switched to an "off" or non-conducting state when a high voltage is applied to its gate by inverter 242. When the p-channel switch transistor 240 is turned off, then there is no current sink path between the I/O pin 214 and the supply voltage 220, and there is no voltage clamp action by the diode 500. Thus, the current sink-voltage clamp overvoltage protection circuitry 216 is inoperative. The leakage current blocking overvoltage protection circuitry 210 is operative instead.

The source and back gate of the pull-up transistor 244 of inverter 242 is coupled to the n-well so that when the switch transistor 240 is turned off, it stays off even if the I/O pin voltage increases above the internal supply voltage level. More specifically, when the n-well voltage rises above the internal supply level VCCN, the voltage applied to the gate of the switch transistor 240 also will increase, ensuring that the transistor 240 remains switched off. In other words, even if the floating n-well voltage exceeds the internal supply voltage 220, transistor 240 will remain switched off since the voltage applied to the gate of transistor 240 will increase with the increased n-well voltage due to the back gate connection between the pull-up transistor 244 and the n-well. Thus, the back gate to n-well connection of the pull-up transistor 244 ensures that there is substantially no leakage current through transistor 240 when it is turned off, and the current sink-voltage clamp overvoltage protection circuitry 216 is inoperative.

Programmable Switch Control Circuit

The operation of the two input overshoot protection circuits of the presently preferred embodiment is controlled by a programming element 218. The switch control circuit can be programmed to cause either the current blocking circuitry 210 to be operative, or to cause the current sink-voltage clamp circuitry 216 to be operative. Basically, when transistor 240 is switched off, the current blocking circuitry 210 is operative, and the current sink voltage clamp circuitry 216 is inoperative. When the transistor 240 is switched on, the current sink voltage clamp circuitry 216 is operative, and the current blocking circuitry 210 is inoperative.

The inverter 242 includes an n-channel pull-down transistor 246 and the p-channel pull-up transistor 244 connected to provide an output to the gate of the p-channel switch transistor 240. The pull-up transistor of the inverter 242 is formed in the same n-well as transistor 240. The source of the p-channel pull-up transistor 244 is connected to the source of the p-channel switch transistor 240 and has a back gate connection to the n-well.

A half-latch circuit 246 includes inverter 248 which includes an n-channel pull-down transistor 250 and a p-channel pull-up transistor 252 connected as shown with the source of the p-channel pull-up transistor 252 connected to noisey supply voltage VCCN and with the drain of the n-channel pull-up transistor 250 connected to ground. The I2 output is connected to the input of inverter 242. The half latch 246 also includes a p-channel pull-up transistor 254 with a source connected to noisey supply voltage VCCN, with drain connected to ground and with gate connected to the I2 output. The role of the half-latch 246 is to restore the gate of inverter 248 to the full VCCN supply level when there is a threshold voltage drop across pass gate transistor 256. More specifically, when the gate of inverter 248 is high, the pull-up transistor 254 pulls the gate voltage up to the full VCCN level, thereby ensuring that inverter 248 is fully off and no current flows through it.

The pass gate transistor 256 serves to isolate inverter 258 from supply voltage VCCN. The pass gate transistor 256 limits the voltage at the output of inverter 258 to not exceed the supply voltage VCCQ. This prevents unduly overstressing the devices used to form the inverter 258 which may be operating with a lower core supply voltage. The inverter 258 serves as a buffer between the programming element 218 and the rest of the clamp circuitry.

The programming element 218 is programmable to turn switch transistor 240 on or off. In a present embodiment, the programming element 218 comprises a programmable SRAM cell. Alternatively, the programming element 218 may be implemented as a floating gate, a programmable link, fuse or anti-fuse or a register circuit, just to name a few. The programming element 218 provides an input signal to inverter 258. The operation of the programming element 218 will be readily understood from the description of the "functional control elements" in the above-identified patents describing programmable logic devices.

In operation the programming element 218 may be programmed to output a logic high voltage level or a logic low voltage level. In the present embodiment, a logic low voltage level output from the programming element 218 causes a logic high voltage level to be applied to the gate of switch transistor 240 which results in transistor 240 being switched off which causes the current blocking protection circuit 210 to be operative. On the other hand, a logic high voltage level output from the programming element 218 causes a logic low voltage level to be applied to the gate of switch transistor 240 which results in transistor 240 being switched on which causes the current sink-voltage clamp protection circuit 216 to be operative.

It will be appreciated that the outputs of the programming elements 218 of different I/O pins of a single integrated circuit can be programmed independently of each other, on an I/O pin by I/O pin basis. That means that the type of overshoot protection circuitry selected for one I/O pin of an IC can be programmed independently of the type of overshoot protection circuitry selected for other I/O pins of the same IC. Different I/O pins of the same IC can be programmed with different types of overshoot protection circuitry. Thus, the same IC may be coupled to different types of systems (e.g., mixed signal and PCI). This results in more flexibility in how the IC can be interfaced to an electronic system. Furthermore, the selection of the protection circuitry to be operative for the different I/O pins of an IC can be made later in the design and development cycle of a system that will employ the IC. For instance, in a current embodiment in which the IC is an FPGA, the SRAM cell of the programmable element is programmed using a bit stream used to program the FPGA when implementing a design and does not require any "hard wiring."

Examples of Further Embodiments

Figure 3:
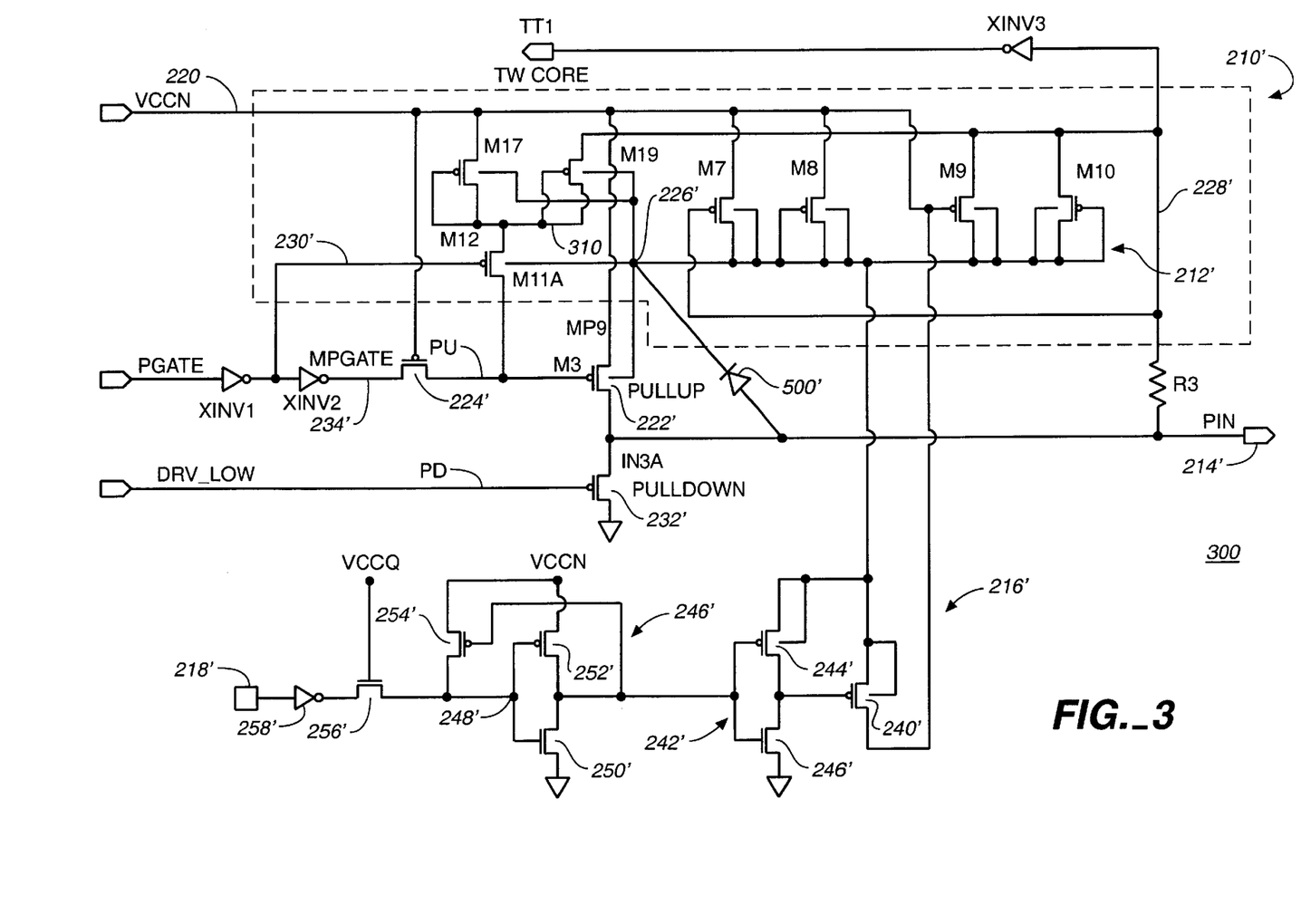
FIG. 3 is a circuit diagram of another high-voltage tolerant I/O circuit in accordance with an alternative embodiment of the invention.

FIG. 3 is a diagram of a first alternative embodiment of the high-voltage tolerant I/O circuit 300 in accordance with the present invention. In FIG. 3, a voltage bias generator 212' is similar to voltage bias generator 212 of FIG. 2. Only the differences between voltage bias generator 212' and voltage bias generator 212 will be discussed. Components in FIG. 3 that are substantially the same as corresponding components in FIG. 2 are labeled with primed reference numbers. The current sink-voltage clamp overvoltage protection circuitry are identical in FIGS. 2 and 3.

Voltage bias generator 212' has a bias output node 226' which is coupled to the n-well of pull-up driver 222'. Transistors M7, M8, M9, and M10 are configured and operate similarly as the similarly labeled transistors in voltage bias generator 212'. These transistors generate the voltage at n-well voltage bias generator output node 226'.

A voltage at PU is generated by transistors M17, M19, and M11A, in contrast to a single transistor M11 in the embodiment of FIG. 2. Transistor M17 is coupled between first supply 220' and a node 310. A control electrode of transistor M17 is coupled to node 310. Transistor M19 is coupled between node 228' and node 310. A control electrode of transistor M19 is coupled to node 310. Transistor M11A is coupled between node 233 and PU. A control electrode of transistor M11A is coupled to an output of inverter XINV1.

In a preferred embodiment, transistors M17, M19, and M11A are PMOS devices. N-well connections for these transistors are coupled to bias output node 226'.

In operation, when PU is low, the output of inverter XINV1 will be high. In this case, transistor M11A will be off and effectively decoupled from node PU. This is the case when pin 214' is driven to a logic high. The I1 and I2 current paths are not of a concern.

On the other hand, when PU is high, the output of inverter XINV1 will be low. In this case, transistor M11A will be on. Transistor M11 will effectively couple a voltage at node 310 to node PU. This voltage at PU is used to prevent current path I1 described above. Transistors M17 and M19 will operate analogously to transistor M8 and M10 to bias the voltage at PU. The operation of this circuitry will be described in relation to the voltage at pin 214'.

When VPIN is less than about VCC, the circuitry will drive PU to about VCC−|VTP| through transistors M17 and M11A. This is analogous to the operation of transistor M8, which was described above. Therefore, the I1 leakage current path will be prevented, or at least substantially reduced, under these conditions.

When VPIN is above about VCC, the circuitry will drive PU to about VPIN−|VTP| through transistors M19 and M11A. This is analogous to the operation of transistor M10, which was described above. In this case, the I1 current path will also be prevented, or at least substantially reduced, since PU will be within a |VTP| of VPIN.

Therefore, voltage bias generator 212' in FIG. 3 operates similarly to voltage bias generator 212 in FIG. 2. This is because transistor M17 serves a similar function as transistor M8, and transistor M19 serves a similar function as transistor M10. The circuit configuration in FIG. 2 is preferred since fewer transistors are required. Otherwise, the operation of both voltage bias generator circuits is largely functionally equivalent.

In different embodiments of the present invention, some of the devices may be thick oxide devices as was discussed in FIG. 2. For example, as was discussed above, pull-down driver transistor 232' and transistor M11A should be thick oxide devices to improve their oxide stress reliability. To ensure a similar VTP, transistors M7 and M9 may be thick oxide devices. Transistors M8, M3, M17, and pull-up driver transistor 810 may also be thick oxide devices in order to improve their oxide reliability. M10 and M19 may be thick oxide devices.

Figure 4:
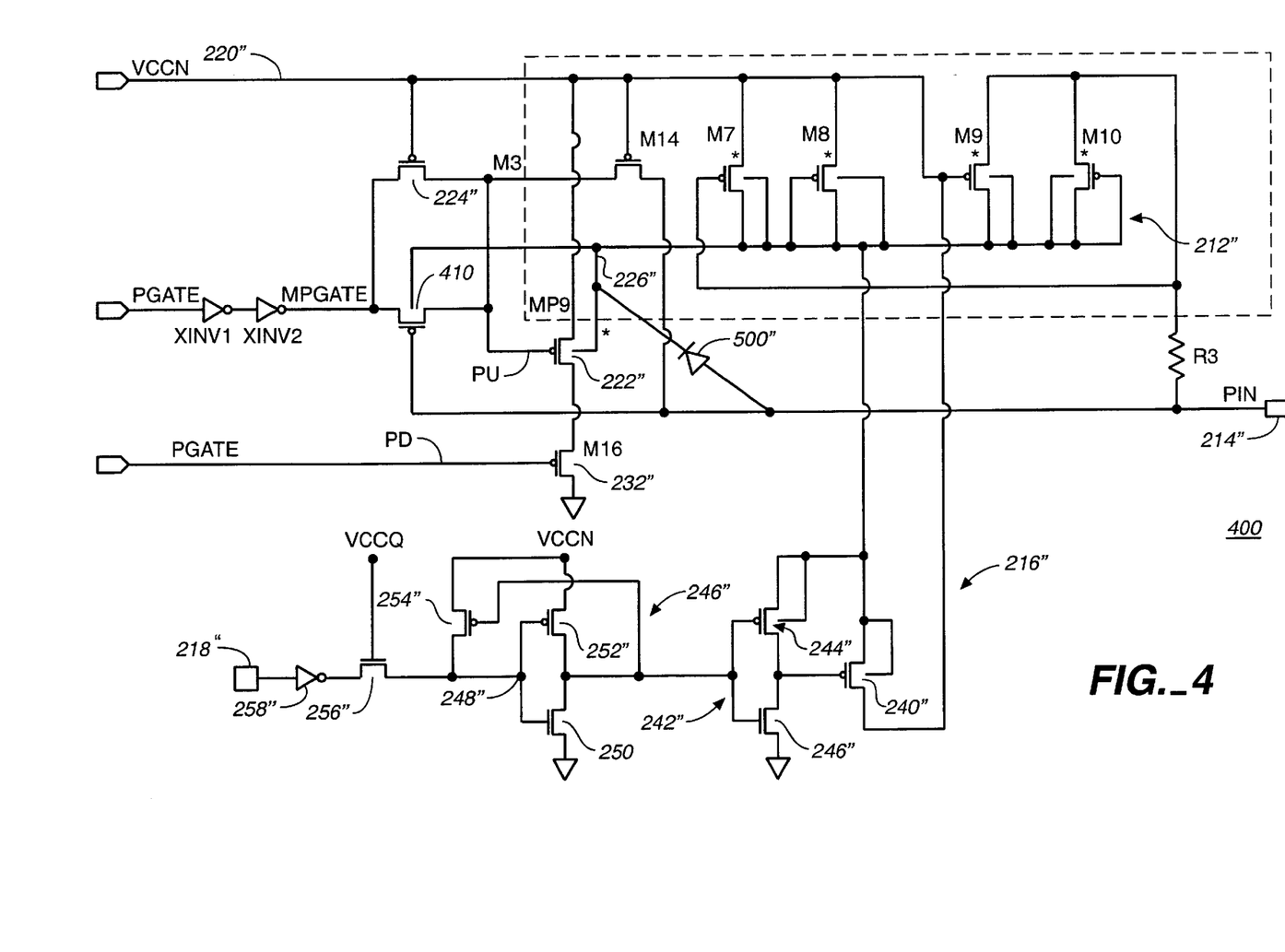
FIG. 4 is a circuit diagram of still another high-voltage tolerant I/O circuit in accordance with another alternative embodiment of the invention.

FIG. 4 shows a second alternative embodiment of a high-voltage tolerant I/O circuit 400 in accordance with the present invention. This voltage bias generator shares similarities with those shown in FIGS. 2 and 3. Only the differences between the circuits will be described below. Components in FIG. 4 that are substantially the same as corresponding components in FIG. 2 are labeled with double-primed reference numbers. The current sink-voltage clamp overvoltage protection circuitry are identical in FIGS. 2 and 4.

Voltage bias generator 212" is similar to voltage bias generator 212 of FIG. 2. Transistors M7, M8, M9, and M10 are configured and operate similarly to the similarly labeled transistors in FIG. 2. An n-well voltage bias generator output node 212" is coupled to the n-well connection of pull-up driver 222'. The n-well voltage bias generator 212" will prevent the I2 current path, as was previously described.

In this embodiment, a transistor M14 is coupled between pin 214" and PU. A control electrode of transistor M14 is coupled to first supply 220". A pass transistor 410 is coupled in parallel with pass transistor 224". A control electrode of pass transistor 410 is coupled to pin 214". In a preferred embodiment, transistor M14 and pass transistor 410 are PMOS transistors, and pass transistor 224" is an NMOS transistor. N-well connections for transistor M14 and pass transistor 410 are coupled to the n-well voltage "bias" generator output node 226".

In operation, when VPIN is less than about VCC+|VTP|, transistor M14 will not conduct, and decouples pin 214" from PU. Also, when VPIN is less than about VCC−|VTP|, transistor 410 will be on and allow a full-rail logic high voltage (e.g., 3.3 volts when VCC is 3.3 volts) to pass to PU. These transistors ensure that I1 leakage current path will not be of a concern. These transistors ensure the voltage level at PU will be within about a |VTP| of VPIN, and consequently, there will be no I1 leakage current path.

When VPIN goes above VCC+|VTP|, M14 turns on, and PU gate will track VPIN through transistor M14. Under these conditions, the I1 leakage current path will not be a concern since the VPIN will be within about a |VTP| of the voltage at PU. Basically, turning on M14 raises the PU gate of 222 high to VPIN which shuts off 222 and prevents I1 leakage conduction from VPIN to VCCN.

Further, in an alternative embodiment of the present invention, pass transistor 224" is a native device. A native device is a transistor which has no or minimal VT adjust implant so that the transistor's threshold voltage (Vtnative) is about zero volts or slightly above. For example, Vtnative may be about 0.2 volts. In the case when Vtnative is less than |VTP|, pass transistor 410 may be omitted from the circuitry, thus saving some silicon area.

The circuitry would still function properly because the voltage at PU will be at least about VCC−Vtnative. Specifically, when VCC is driven through pass transistor 224", the voltage at PU will be about VCC−Vtnative. This ensures VPIN will be within a |VTP| of the voltage at PU.

Therefore, current path I1 will be prevented.

In different embodiments of the present invention, some of the devices may be thick oxide devices as was discussed for FIGS. 2 and 3. For example, as was discussed above, pull-down driver 232" transistor and transistor 410 should be thick oxide devices to improve their oxide stress reliability. To ensure a similar VTP, transistors M7 and M9 may be thick oxide devices. Transistors M8, M3, M10, M14, and pull-up driver transistor 222" may also be thick oxide devices in order to improve their oxide reliability.

While particular embodiments of the invention have been described in detail, various modifications to the preferred embodiments can be made without departing from the spirit and scope of the invention. For instance, the present invention has been explained as part of a programmable logic device. However, the invention can be employed in other types of integrated circuits as well. Moreover, the invention has been explained in connection with the current sink requirements of the PCI architecture. Although the invention may be employed to provide I/O circuit protection in other environments requiring the ability to sink current during overshoot excursions on an I/O pin. Thus, the invention is limited only by the appended claims.

What is claimed is:

1. An integrated circuit for use with a supply voltage and which includes an input/output (I/O) circuit with an output driver which includes an I/O pin connected to receive output signals from the output driver and connected to provide input signals to the integrated circuit, comprising:

first circuitry which is operable to substantially prevent leakage current when voltage applied externally to the I/O pin rises above the supply voltage;

second circuitry which is operable to sink current from the I/O pin to the supply voltage when voltage applied externally to the I/O pin rises above the supply voltage; and programming circuitry which is programmable to cause the first circuitry or the second circuitry to be operative.

2. The integrated circuit of claim 1, wherein the output driver includes a pull-up transistor; and wherein the first circuitry includes bias circuitry that imparts a bias voltage to the pull-up transistor, wherein the bias voltage rises above the supply voltage when a voltage applied externally to the I/O pin rises above the supply voltage.

3. The integrated circuit of claim 1, wherein the output driver includes a pull-up transistor; and wherein the first circuitry includes bias circuitry that imparts a bias voltage to a back gate of the pull-up transistor, wherein the bias voltage rises above the supply voltage when a voltage applied externally to the I/O pin rises above the supply voltage.

4. The integrated circuit of claim 1, wherein the output driver includes a pull-up transistor; and wherein the first circuitry includes bias circuitry that imparts a bias voltage to the pull-up transistor, wherein the bias voltage substantially follows the I/O pin voltage when a voltage applied externally to the I/O pin rises above the supply voltage.

5. The integrated circuit of claim 1, wherein the output driver includes a pull-up transistor; and wherein the first circuitry includes bias circuitry that imparts a bias voltage to a back gate of the pull-up transistor, wherein the bias voltage substantially follows the I/O pin voltage when a voltage applied externally to the I/O pin rises above the supply voltage.

6. The integrated circuit of claim 1, wherein the output driver includes a pull-up transistor; and wherein the first circuitry includes:

an n-well:

an n-well bias generator which causes n-well voltage to substantially follow I/O pin voltage when voltage applied externally to the I/O pin voltage rises above the supply voltage;

an I/O pin connection between the I/O pin and the n-well bias generator; and a bias connection between the n-well and the pull-up transistor.

7. The integrated circuit of claim 6, wherein the output driver includes a pull-up transistor; and wherein the bias connection includes a switch that couples a back gate of the pull-up transistor to the n-well when the pull-up transistor is turned off and which decouples the back gate of the pull-up transistor from the n-well when the pull-up transistor is turned on.

8. The integrated circuit of claim 6 wherein the I/O pin connection includes an electrostatic discharge element.

9. The integrated circuit of claim 1, wherein the output driver includes a pull-up transistor; and wherein the first circuitry includes:

an n-well:

multiple p-channel transistors formed in the n-well and connected to cause n-well voltage to substantially follow I/O pin voltage when voltage applied externally to the I/O pin voltage rises above the supply voltage;

an I/O pin connection between the I/O pin and at least one p-channel transistor formed in the n-well; and a bias connection between at least one transistor formed in the n-well and the pull-up transistor.

10. The integrated circuit of claim 1 wherein the first circuitry includes:

an n-well;

a bias generator output node;

an I/O pin connection;

first and second transistors formed in the n-well with sources connected to the supply voltage and with drains connected to the bias generator output node; and wherein a gate of the first transistor is connected to the I/O pin connection and a gate of the second transistor is connected to the bias generator output node; and third and fourth transistors formed in the n-well with sources connected to the I/O pin connection and with drains connected to the bias generator output node; and wherein a gate of the third transistor is connected to the supply voltage and a gate of the fourth transistor is connected to the bias generator output node.

11. The integrated circuit of claim 10, wherein the output driver includes a pull-up transistor; and further including:

a bias connection which includes a fifth transistor formed in the n-well that couples a back gate of the pull-up transistor to the n-well when the pulltransistor is turned off and which decouples the back gate of the pull-up transistor from the n-well when the pull-up transistor is turned on.

12. The integrated circuit of claim 10,
wherein the output driver includes a pull-up transistor; and further including:
a bias connection which includes:
   a fifth transistor formed in the n-well that couples a back gate of the pull-up transistor to the n-well when the pull-up transistor is turned off and which decouples the back gate of the pull-up transistor from the n-well when the pull-up transistor is turned on;
   a sixth transistor formed in the n-well with a source connected to the supply voltage and a gate and drain connected to the source of the fifth transistor and a back gate connected to the bias connection; and
   a seventh transistor formed in the n-well with a source connected to the I/O pin connection and a gate and drain connected to the source of the fifth transistor and a back gate connected to the bias connection.

13. The integrated circuit of claim 10,
wherein the output driver includes a pull-up transistor; and further including:
a bias connection which includes:
   a fifth transistor formed in the n-well that couples a back gate of the pull-up transistor to the n-well when the pull-up transistor is turned off and which decouples the back gate of the pull-up transistor from the n-well when the pull-up transistor is turned on; and
   sixth, seventh and eighth transistors:
      wherein the sixth transistor is formed in the n-well and includes a gate connected to the supply voltage and a back gate connected to the bias connection and another terminal connected to the I/O pin and yet another terminal connected to the gate of the pull-up transistor;
      wherein the seventh transistor includes a gate connected to the supply voltage and another terminal connected to the gate of the pull-up transistor and yet another terminal connected to a terminal of the eighth transistor; and
      wherein the eighth transistor also includes a gate connected to the I/O pin and a back gate connected to the bias connection and yet another terminal connected to the gate of the pull-up transistor.

14. The integrated circuit of claim 1 wherein the second circuitry includes:
a switch connected to conduct current from the I/O pin to the supply voltage when the switch is turned on and to block current flow from the I/O pin to the supply voltage when the switch is turned off.

15. The integrated circuit of claim 1 wherein the second circuitry includes:
a switch connected to conduct current from the I/O pin to the supply voltage when the switch is turned on and to block current flow from the I/O pin to the supply voltage when the switch is turned off; and
voltage clamp circuitry connected to clamp voltage on the I/O pin to the supply voltage when the switch is turned on.

16. An electronic system which includes multiple integrated circuits and at least one shared bus wherein at least one of the integrated circuits is the integrated circuit of claim 1.

17. An electronic system which includes multiple integrated circuits and at least one shared bus wherein at least one of the integrated circuits is the integrated circuit of claim 1 and wherein the at least one integrated circuit includes an I/O pin connected to first circuitry which is operative and includes another I/O pin connected to second circuitry which is operative.

18. An integrated circuit for use with a supply voltage and which includes an input/output (I/O) circuit with an output driver and an I/O pin connected to receive output signals from the output driver and connected to provide input signals to the integrated circuit, comprising:
first circuitry which is operable to substantially prevent leakage current when voltage applied externally to the I/O pin rises above the supply voltage;
second circuitry which is operable to sink current from the I/O pin when voltage applied externally to the I/O pin rises above the supply voltage;
wherein the second circuitry includes:
   a switch connected to conduct current from the I/O pin to the supply voltage when the switch is turned on and to block current flow from the I/O pin to the supply voltage when the switch is turned off; and
   a diode connected to clamp voltage on the I/O pin to the supply voltage when the switch is turned on; and
programming circuitry which is programmable to cause the first circuitry or the second circuitry to be operative.

19. The integrated circuit of claim 18 wherein the switch includes a p-channel transistor that is at least 1500 Angstroms wide.

20. An integrated circuit for use with a supply voltage and which includes an input/output (I/O) circuit with an output driver which includes an I/O pin connected to receive output signals from the output driver and connected to provide input signals to the integrated circuit comprising:
first circuitry which is operable substantially prevent leakage current when voltage applied externally to the I/O pin rises above the supply voltage; and
second circuitry which is operable to clamp I/O pin voltage to the supply voltage; and
programming circuitry which is programmable to cause the first circuitry or the second circuitry to be operative.

21. The integrated circuit of claim 20 wherein the second circuitry includes a switch connected to conduct current from the I/O pin to a supply voltage when the switch is turned on and to block current flow from the I/O pin to the supply voltage when the switch is turned off.

22. The integrated circuit of claim 1 or 20 wherein the programming circuitry includes an element that is programmable to produce a first logical value or a second logical value.

23. The integrated circuit of claim 1 or 20 wherein the programming circuitry includes an SRAM cell.

24. The integrated circuit of claim 1 or 20 wherein the programming circuitry includes a floating gate cell.

25. The integrated circuit of claim 1 or 20 wherein the programming circuitry includes a fuse.

26. The integrated circuit of claim 1 or 20 wherein the programming circuitry includes an antifuse.

27. The integrated circuit of claim 1 or 20 wherein the programming circuitry includes a register circuit.

28. An electronic system which includes multiple integrated circuits and at least one shared bus wherein at least one of the integrated circuits is the integrated circuit of claim 20.

29. An electronic system which includes multiple integrated circuits and at least one shared bus wherein at least one of the integrated circuits is the integrated circuit of claim 20 and wherein the at least one integrated circuit includes an I/O pin connected to first circuitry which is operative and includes another I/O pin connected to second circuitry which is operative.

30. The integrated circuit of claim 1 wherein the programming circuitry is programmable to cause one of the first circuitry and the second circuitry to be operative and to cause the other of the first circuitry and the second circuitry to be inoperative.

31. The integrated circuit of claim 20 wherein the programming circuitry is programmable to cause one of the first circuitry and the second circuitry to be operative and to cause the other of the first circuitry and the second circuitry to be inoperative.

32. An integrated circuit for use with a supply voltage and which includes an input/output (I/O) circuit with an output driver which includes an I/O pin connected to receive output signals from the output driver and connected to provide input signals to the integrated circuit comprising:
    first protection circuitry which includes,
        an n-well;
        multiple p-channel transistors formed in an n-well and connected to cause n-well voltage to substantially follow I/O pin voltage when voltage applied externally to the I/O pin rises above the supply voltage;
    second protection circuitry which includes,
        a switch connected to conduct current from the I/O pin to the supply voltage when the switch is turned on and to block current flow from the I/O pin to the supply voltage when the switch is turned off; and
        voltage clamp circuitry connected to clamp voltage on the I/O pin to the supply voltage when the switch is turned on; and
    programming circuitry which is programmable to cause the first protection circuitry or the second protection circuitry to be operative.

33. An integrated circuit for use with a supply voltage and which includes an input/output (I/O) circuit with an output driver with a pull-up transistor and which includes an I/O pin connected to receive output signals from the output driver and connected to provide input signals to the integrated circuit comprising:
    bias circuitry that imparts a bias voltage to the pull-up transistor that follows an externally applied I/O pin voltage when the I/O pin voltage rises above the supply voltage so as to substantially prevent leakage current when a voltage applied externally to the I/O pin rises above the supply voltage;
    a switch connected to conduct current from the I/O pin to the supply voltage when the switch is turned on and to block current flow from the I/O pin to the supply voltage when the switch is turned off,
    voltage clamp circuitry connected to clamp voltage on the I/O pin to the supply voltage when the switch is turned on and to thereby cause the bias circuitry to be inoperative; and
    switch control circuitry to turn the switch on and off.

34. The integrated circuit of claim 33 further including:
    an n-well;
    multiple p-channel transistors formed in an n-well and connected to cause n-well voltage to substantially follow I/O pin voltage when voltage applied externally to the I/O pin rises above the supply voltage;
    wherein the switch includes a p-channel transistor with a back gate connection to the n-well.

35. The integrated circuit of claim 33 wherein the switch control circuitry outputs either a logic high value or a logic low value.

36. The integrated circuit of claim 33 wherein the switch control circuitry includes a programmable storage cell for storing either a logic high value or a logic low value.

37. An integrated circuit for use with a supply voltage and which includes an input/output (I/O) circuit with an output driver with a pull-up transistor and which includes an I/O pin connected to receive output signals from the output driver and connected to provide input signals to the integrated circuit comprising:
    bias circuitry that imparts a bias voltage to the pull-up transistor so as to substantially prevent leakage current when a voltage applied externally to the I/O pin rises above the supply voltage;
    wherein the bias circuitry includes an n-well and multiple p-channel transistors formed in an n-well and connected to cause n-well voltage to substantially follow I/O pin voltage when voltage applied externally to the I/O pin rises above the supply voltage;
    a switch connected to conduct current from the I/O pin to the supply voltage when the switch is turned on and to block current flow from the I/O pin to the supply voltage when the switch is turned off,
    voltage clamp circuitry connected to clamp voltage on the I/O pin to the supply voltage when the switch is turned on;
    switch control circuitry to turn the switch on and off;
    wherein the switch includes a p-channel transistor with a back gate connection to the n-well; and further including:
        an inverter circuit connected between the output of the programming circuitry and a gate of the switch transistor, wherein the inverter circuit includes a p-channel pull-up transistor and an n-channel pull-down transistor; and
        wherein the p-channel pull-up transistor includes a back gate connection the n-well.

38. An integrated circuit for use with a supply voltage and which includes an input/output (I/O) circuit with an output driver with a pull-up transistor and which includes an I/O pin connected to receive output signals from the output driver and connected to provide input signals to the integrated circuit comprising:
    bias circuitry that imparts a bias voltage to the pull-up transistor so as to substantially prevent leakage current when a voltage applied externally to the I/O pin rises above the supply voltage;
    wherein the bias circuitry includes an n-well and multiple p-channel transistors formed in an n-well and connected to cause n-well voltage to substantially follow I/O pin voltage when voltage applied externally to the I/O pin rises above the supply voltage;
    a switch connected to conduct current from the I/O pin to the supply voltage when the switch is turned on and to block current flow from the I/O pin to the supply voltage when the switch is turned off;
    voltage clamp circuitry connected to clamp voltage on the I/O pin to the supply voltage when the switch is turned on;
    a programming element;
    wherein the switch includes a p-channel switch transistor with a back gate connection to the n-well;
    an inverter circuit connected between an output of the programming element and a gate of the switch transistor wherein the inverter circuit includes a p-channel pull-up transistor and an n-channel pull-down transistor;

wherein the inverter p-channel pull-up transistor includes a back gate connection the n-well; and a half-latch circuit connected between an input to the inverter circuit and the programming element.

39. An integrated circuit for use with a supply voltage and which includes an input/output (I/O) circuit with an output driver with a pull-up transistor and which includes an I/O pin connected to receive output signals from the output driver and connected to provide input signals to the integrated circuit comprising:

bias circuitry that imparts a bias voltage to the pull-up transistor so as to substantially prevent leakage current when a voltage applied externally to the I/O pin rises above the supply voltage;

wherein the bias circuitry includes an n-well and multiple p-channel transistors formed in an n-well and connected to cause n-well voltage to substantially follow I/O pin voltage when voltage applied externally to the I/O pin rises above the supply voltage;

a switch connected to conduct current from the I/O pin to the supply voltage when the switch is turned on and to block current flow from the I/O pin to the supply voltage when the switch is turned off;

voltage clamp circuitry connected to clamp voltage on the I/O pin to the supply voltage when the switch is turned on;

a programming element;

wherein the switch includes a p-channel switch transistor with a back gate connection to the n-well and further including:

an inverter circuit connected between the output of the programming element and a gate of the switch transistor wherein the inverter circuit includes a p-channel pull-up transistor and an n-channel pull-down transistor;

wherein the p-channel pull-up transistor includes a back gate connection the n-well;

a half-latch circuit connected between an input to the inverter circuit and the programming element;

a pass gate connected between the half latch and the programming element; and a second inverter connected between the pass gate and the programming element.

40. An integrated circuit for use with a supply voltage and which includes an input/output (I/O) circuit with an output driver and which includes an I/O pin connected to receive output signals from the output driver and connected to provide input signals to the integrated circuit, comprising:

first means for blocking current flow from the I/O pin to the integrated circuit when voltage applied externally to the I/O pin rises above the supply voltage;

second means for sinking current from the I/O pin to the supply voltage when voltage applied externally to the I/O pin rises above the supply voltage; and means for causing the first means or the second means to be operative.

41. An integrated circuit for use with a supply voltage and which includes an input/output (I/O) circuit with an output driver and which includes an I/O pin connected to receive output signals from the output driver and connected to provide input signals to the integrated circuit, comprising:

first means for blocking leakage current when voltage applied externally to the I/O pin rises above the supply voltage;

second means for clamping I/O pin voltage to the supply voltage when voltage applied externally to the I/O pin rises above the supply voltage; and means for causing the first means or the second means to be operative.

42. An integrated circuit which is used with a supply voltage and which includes multiple I/O circuits, each I/O circuit comprising:

an output driver;

an input/output (I/O) pin connected to receive output signals from the output driver and connected to provide input signals to the integrated circuit;

first circuitry which is operable to substantially prevent leakage current when voltage applied externally to the I/O pin rises above the supply voltage;

second circuitry which is operable to sink current from the I/O pin to the supply voltage when voltage applied externally to the I/O pin rises above the supply voltage; and programming circuitry which is programmable to cause the first circuitry or the second circuitry to be operative.

43. An integrated circuit which is used with a supply voltage and which includes multiple I/O circuits, each I/O circuit comprising:

an output driver;

an input/output (I/O) pin connected to receive output signals from the output driver and connected to provide input signals to the integrated circuit;

first circuitry which is operable to substantially prevent leakage current when voltage applied externally to the I/O pin rises above the supply voltage; and second circuitry which is operable to clamp I/O pin voltage to the supply voltage when voltage applied externally to the I/O pin rises above the supply voltage; and programming circuitry which is programmable to cause the first circuitry or the second circuitry to be operative.

* * * * *